(12) United States Patent
Sung et al.

(10) Patent No.: US 11,101,183 B2
(45) Date of Patent: Aug. 24, 2021

(54) GATE SPACER FORMATION FOR SCALED CMOS DEVICES

(71) Applicant: Varian Semiconductor Equipment Associates, Inc., Gloucester, MA (US)

(72) Inventors: Min Gyu Sung, Essex, MA (US); Sony Varghese, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 51 days.

(21) Appl. No.: 16/037,915

(22) Filed: Jul. 17, 2018

(65) Prior Publication Data
US 2020/0027795 A1 Jan. 23, 2020

(51) Int. Cl.
*H01L 21/8238* (2006.01)
*H01L 29/78* (2006.01)
*H01L 27/092* (2006.01)
*H01L 29/66* (2006.01)

(52) U.S. Cl.
CPC ........... *H01L 21/823864* (2013.01); *H01L 21/823814* (2013.01); *H01L 21/823821* (2013.01); *H01L 29/6656* (2013.01); *H01L 29/66545* (2013.01)

(58) Field of Classification Search
CPC ........... H01L 29/66545; H01L 21/31; H01L 21/823468; H01L 21/823864; H01L 29/6653
See application file for complete search history.

(56) References Cited

U.S. PATENT DOCUMENTS

| | | | |
|---|---|---|---|
| 8,227,920 B2 | 7/2012 | Sung et al. | |
| 9,806,078 B1* | 10/2017 | Xie | H01L 29/6653 |
| 2014/0357039 A1* | 12/2014 | Liu | H01L 29/66477 |
| | | | 438/296 |
| 2015/0372144 A1* | 12/2015 | Fang | H01L 21/823821 |
| | | | 257/192 |

OTHER PUBLICATIONS

"Process engineering to reduce self-aligned contact failure by reducing process-driven thermal stress on tungsten-dual poly gate stacks in sub-60 nm DRAM devices", Authors: Min-Gyu Sung, Yong Soo Kim, Jae Sung Roh, Seunghun Hong, Heonho Kim, Sung Hong Hahn; Microelectronic Engineering 99 (2012) 33-37, 5 pages.

* cited by examiner

*Primary Examiner* — Bradley Smith
*Assistant Examiner* — David J Goodwin
(74) *Attorney, Agent, or Firm* — Kacvinsky Daisak Bluni PLLC

(57) ABSTRACT

Disclosed are methods of forming a CMOS device. One non-limiting method may include providing a gate structure atop a substrate, and forming a first spacer over the gate structure. The method may include removing the first spacer from just an upper portion of the gate structure by performing an angled reactive ion etch or angled implantation disposed at a non-zero angle of inclination with respect to a perpendicular to a plane of the substrate. The method may further include forming a second spacer over the upper portion of the gate structure and the first spacer along a lower portion of the gate structure. A thickness of the first spacer and the second spacer along the lower portion of the gate structure may be greater than a thickness of the second spacer along the upper portion of the gate structure.

20 Claims, 9 Drawing Sheets

GATE SPACER FORMATION FOR SCALED CMOS DEVICES

FIELD OF THE DISCLOSURE

The present disclosure relates to semiconductor devices, and more particularly, to gate spacer formation for scaled CMOS devices using an angled etch process.

BACKGROUND OF THE DISCLOSURE

In the case of a scaled complementary metal-oxide-semiconductor (CMOS) device having a line width under 0.1 μm, an aspect ratio of a gate during formation of a gate structure is dramatically increased as gate pitch is decreased. A torque may be generated on one side when left-right asymmetry of a thermal stress on the gate structure occurs during a subsequent thermal treatment, such as formation of a capping nitride layer. As a result, the gate structure leans to one side. Because, the torque is increased as the aspect ratio of the gate is increased, the leaning effect may become increasingly problematic as the gate pitch is decreased. When the gate leans to one side, a self-aligned contact (SAC) may fail, and thus, production yield may be decreased.

Presently, there is a tension between providing gate spacers for logic devices with thicker dimensions for junction control, and providing gate spacers for logic devices with thinner dimensions to prevent gate leaning due to stresses of the gate spacer. Conventional strait profile spacers are problematic for scaled CMOS devices, as the gate spacing to control spacer reactive ion etching (RIE) decreases.

SUMMARY OF THE DISCLOSURE

In view of the foregoing, what is needed are approaches for gate spacer formation for scaled CMOS devices using an angled etch process. In some approaches, a method includes providing a gate structure atop a substrate, and forming a first spacer over the gate structure. The method may include removing the first spacer from just an upper portion of the gate structure by performing an angled reactive ion etch disposed at a non-zero angle of inclination with respect to a perpendicular to a plane of the substrate. The method may further include forming a second spacer over the upper portion of the gate structure and the first spacer along a lower portion of the gate structure. A thickness of the first spacer and the second spacer along the lower portion of the gate structure may be greater than a thickness of the second spacer along the upper portion of the gate structure.

In some approaches, a method of forming a CMOS device may include providing a dummy gate structure atop a substrate, and forming a first spacer over the dummy gate structure. The method may include removing the first spacer from just an upper portion of the dummy gate structure by performing an angled reactive ion etch disposed at a non-zero angle of inclination with respect to a perpendicular to a plane of the substrate. The method may further include forming a second spacer over the upper portion of the dummy gate structure and over the first spacer along a lower portion of the dummy gate structure. A thickness of the first spacer and the second spacer along the lower portion of the dummy gate structure may be greater than a thickness of the second spacer along the upper portion of the dummy gate structure.

In some approaches, a method of forming a CMOS device may include providing a dummy gate structure atop a substrate, and forming a first gate spacer over the dummy gate structure, wherein the first gate spacer extends along an upper surface of the substrate. The method may include removing the first spacer from just an upper portion of the dummy gate structure by performing an angled reactive ion etch disposed at a non-zero angle of inclination with respect to a perpendicular to a plane of the upper surface of the substrate. The method may include forming a second gate spacer over the upper portion of the dummy gate structure and over the first gate spacer along a lower portion of the dummy gate structure. A thickness of the first gate spacer and the second gate spacer along the lower portion of the dummy gate structure is greater than a thickness of the second gate spacer along the upper portion of the dummy gate structure.

Figure 1:
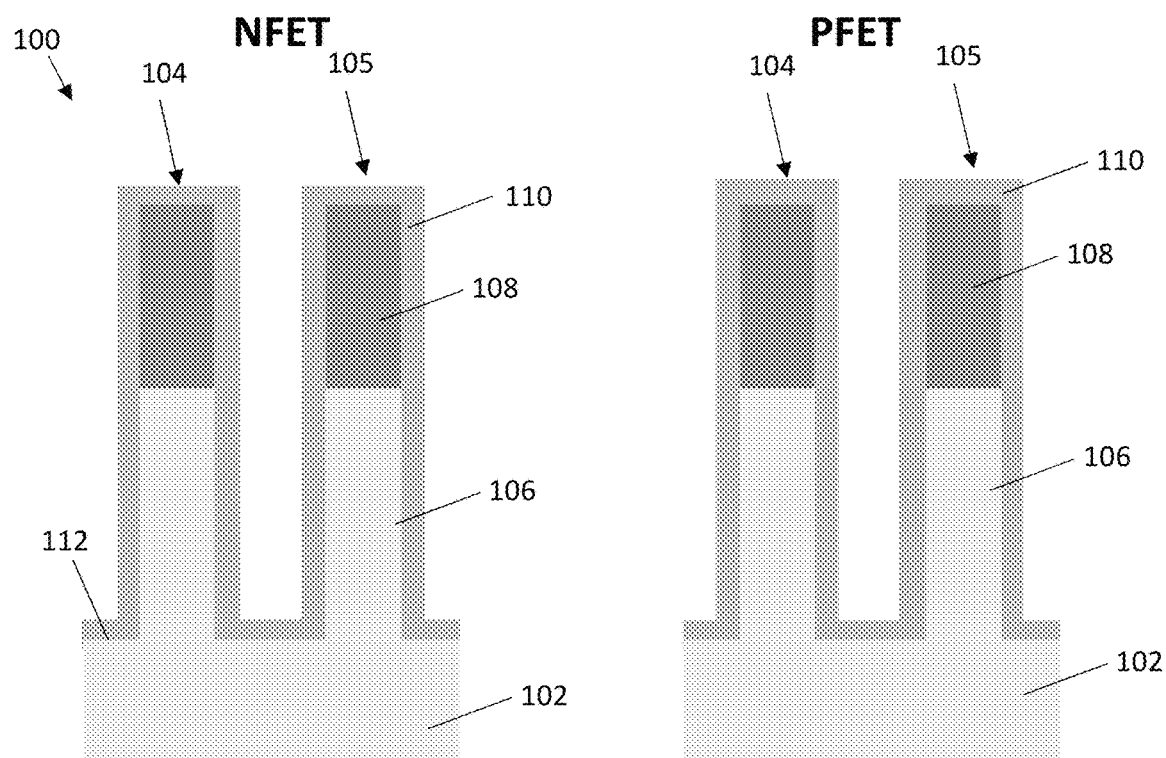
FIGS. 1-10 depict side cross-sectional views of an approach for forming a semiconductor device in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Turning now to FIG. 1, there is shown a cross-sectional view of a CMOS device (hereinafter "device") 100 according to embodiments of the disclosure. An n-type field effect transistor (NFET) and a p-type field effect transistor (PFET) of the device 100 will be shown and described. The device 100 may include a substrate 102, such as a channel region. A first dummy gate structure (hereinafter "first gate") 104 and a second dummy gate structure (hereinafter "second gate") 105 for the NFET and PFET may extend from the substrate 102. In some non-limiting embodiments, the first and second dummy gate structures 104, 105 may include a dummy gate material 106, such as a polysilicon, and a hardmask 108, such as a silicon nitride, deposited over the dummy gate material 106. As further shown, a first spacer 110 may be formed over the device 100. In some non-limiting embodiments, the first spacer 110 may be a conformal layer of silicon nitride (SiN), siliconboron carbonitride ceramic (SiBCN), or silicon oxycarbonitride (SiOCN). As shown, the first spacer 110 extends over the first and second gates 104, 105, as well as along an upper surface 112 of the substrate 102.

In some embodiments, the first and second gates 104, 105 are made from polysilicon. In some embodiments, the first and second gates 104, 105 include silicon dioxide or metal and high-k dielectric materials. Suitable high-k dielectric materials include comprises silicon dioxide ($SiO_2$), silicon oxynitride (SiON), hafnium dioxide ($HfO_2$), zirconium dioxide ($ZrO_2$), combinations thereof or other suitable materials. In some embodiments, first and second gates 104, 105 include multiple layers.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Figure 2:
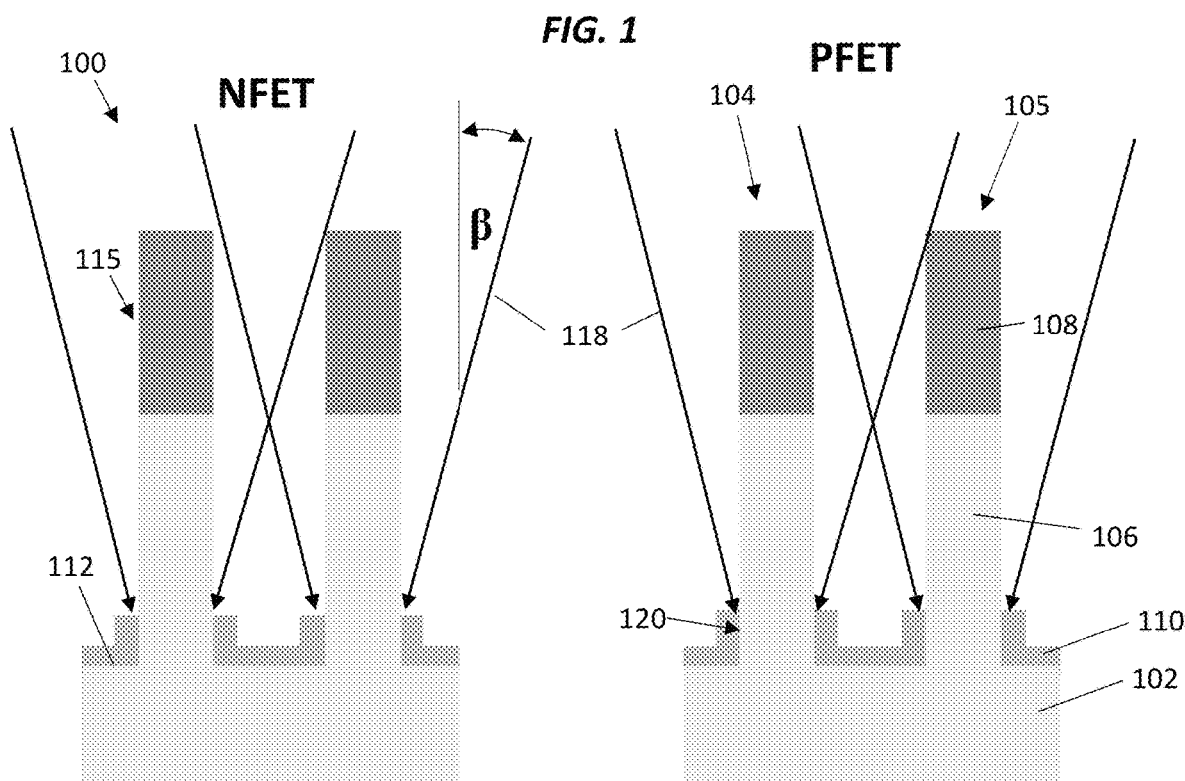

As shown in FIG. 2, a portion of the first spacer 110 may be removed from each of the first and second gates 104, 105. In exemplary embodiments, the first spacer 110 may be removing from just an upper portion 115 of the first and second gate structures 104, 105 by performing an angled reactive ion etch (RIE), shown as arrows 118, disposed at a non-zero angle of inclination β with respect to a perpendicular to a plane defined by the upper surface 112 of the substrate 102. As shown, the RIE 118 does not impact the first spacer 110 along a lower portion 120 of the first and second gates 104, 105. By providing the RIE 118 at the angle of inclination β, a portion 124 of the first spacer 110 between first and second gates 104, 105 and along the upper surface 112 of the substrate 102 is left unetched.

In some embodiments, the angled etch 118 may be performed over two or more etch processes. For example, during operation, the angled etch 118 may be performed while the device 100 is in a first position. Following etching of the spacer 110 in one position, the device 100 may be rotated (e.g., by 30, 45, 60, or 90 degrees), and another etch process may be applied to the device 100. In other embodiments, the device 100 may be stationary, while an etch tool (not shown) is rotated/moved relative to the device 100. The same or similar results can be obtained by angled ion implantation instead of angled RIE. For example, with argon implantation on SiN, the wet etch rate may increase up to 6 times of the unimplanted etch rate for a concentration of 6 E21/$cm^2$. In the case of implantation, the first spacer 110 may be selectively removed by a wet etching process using a diluted hydro-fluoric acid (DHF) solution as an etchant.

Figure 3:
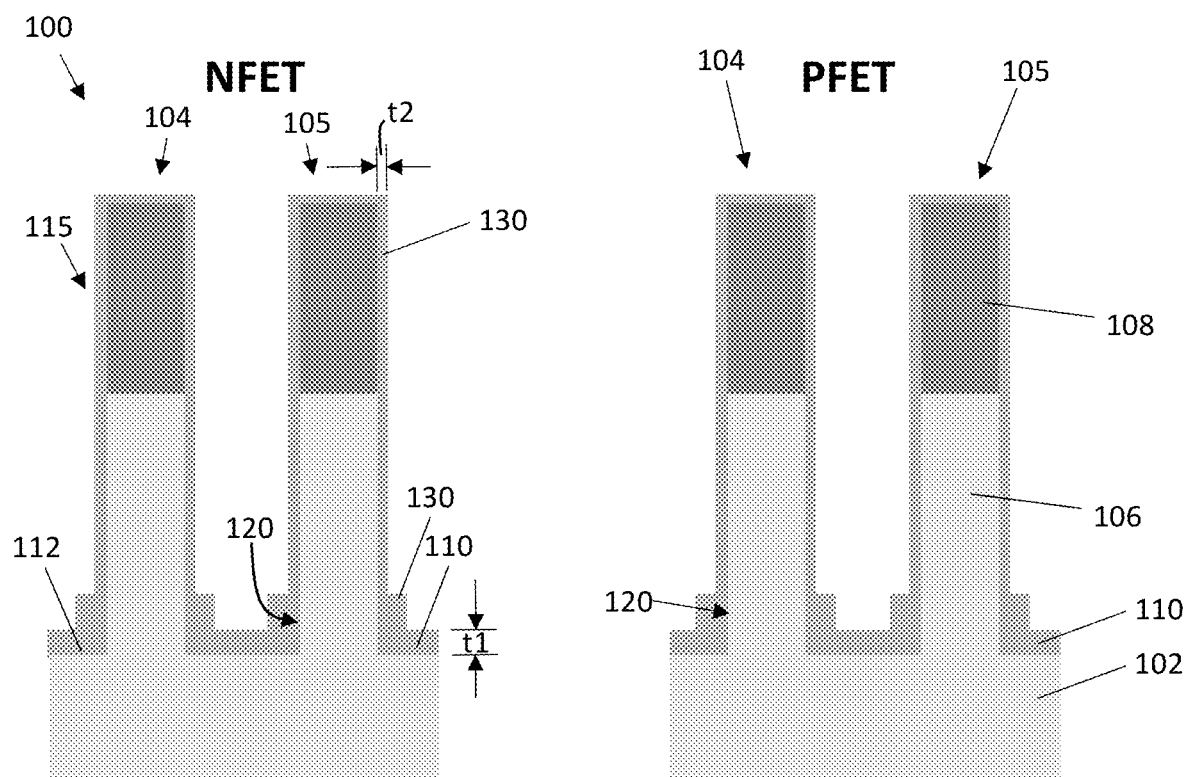

As shown in FIG. 3, a second spacer 130 may be formed over the upper portion 115 of the first and second gates 104 and 105, as well as over the first spacer 110 along the lower portion 120 of the first and second gates 104, 105. In exemplary embodiments, a thickness 't1' of the first spacer 110 and the second spacer 130 along the lower portion 120 of the first and second gates 104, 105 is greater than a thickness 't2' of the second spacer 130 along the upper portion 115 of the first and second gates 104, 105. In some embodiments, the second spacer 130 may be a conformal layer of SiN, SiBCN, or SiOCN. The second spacer 130 may be provided to prevent epi growth on the dummy gate material 106 during source/drain epi process.

In some non-limiting embodiments, the second spacer 130 may be thinner than the first spacer 110 (e.g., the second spacer 130<3 nm) for beneficially reducing the stress to the gate. Furthermore, the spacer thickness (i.e., t1) defining a junction depth is the thickness of the first spacer 110 together with the thickness of the second spacer 130. By providing the first spacer 110 and the second spacer 130 together along the lower portion 120 of the first and second gates 104, 105 and along the upper surface 112 of the substrate, better junction control can be provided. Still furthermore, the relatively thinner second spacer 130 along the upper portion 115 of the first and second gates 104, 105 reduces gate spacer stress, leading to less gate bending for higher aspect ratios.

Figure 4:
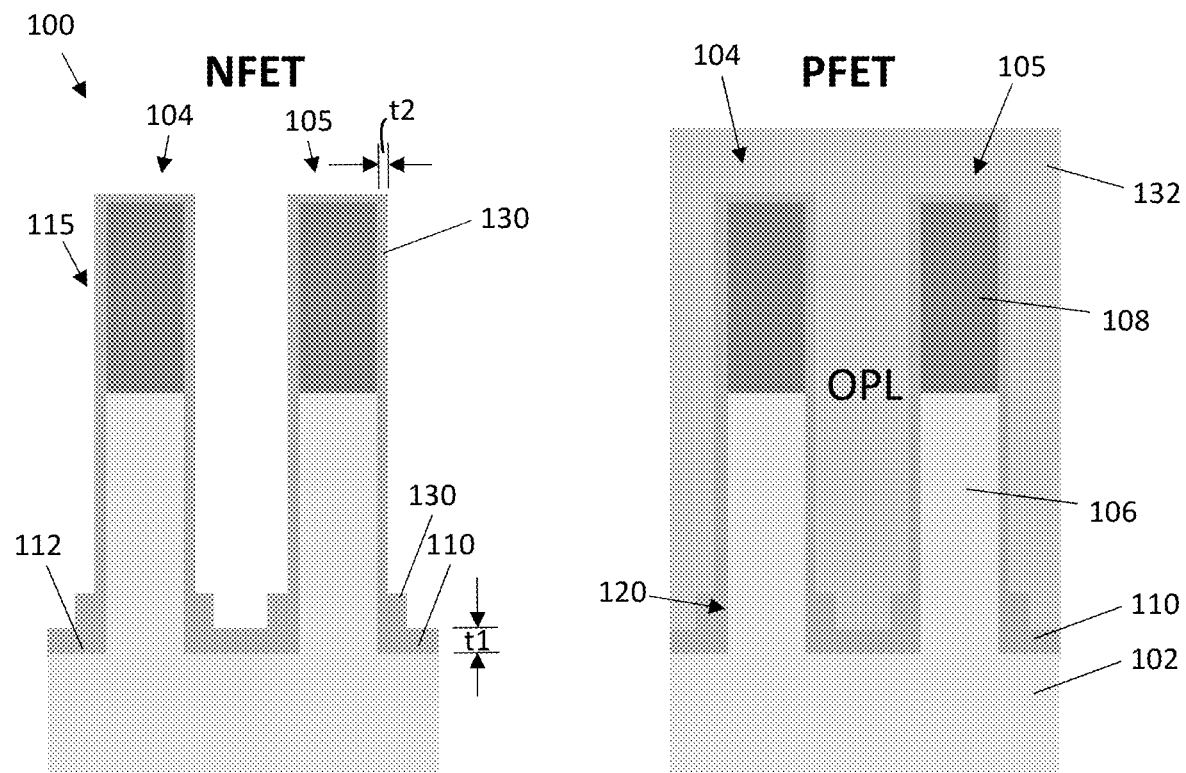
Figure 5:
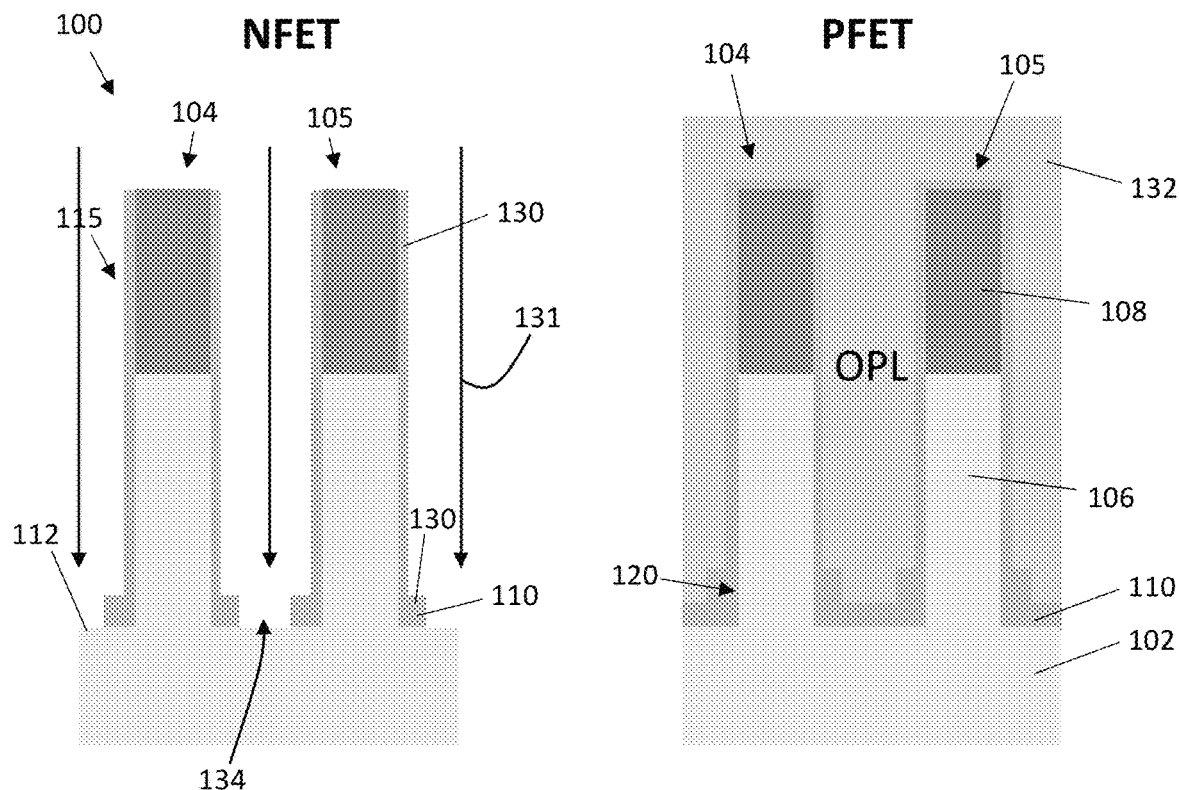
Figure 6:
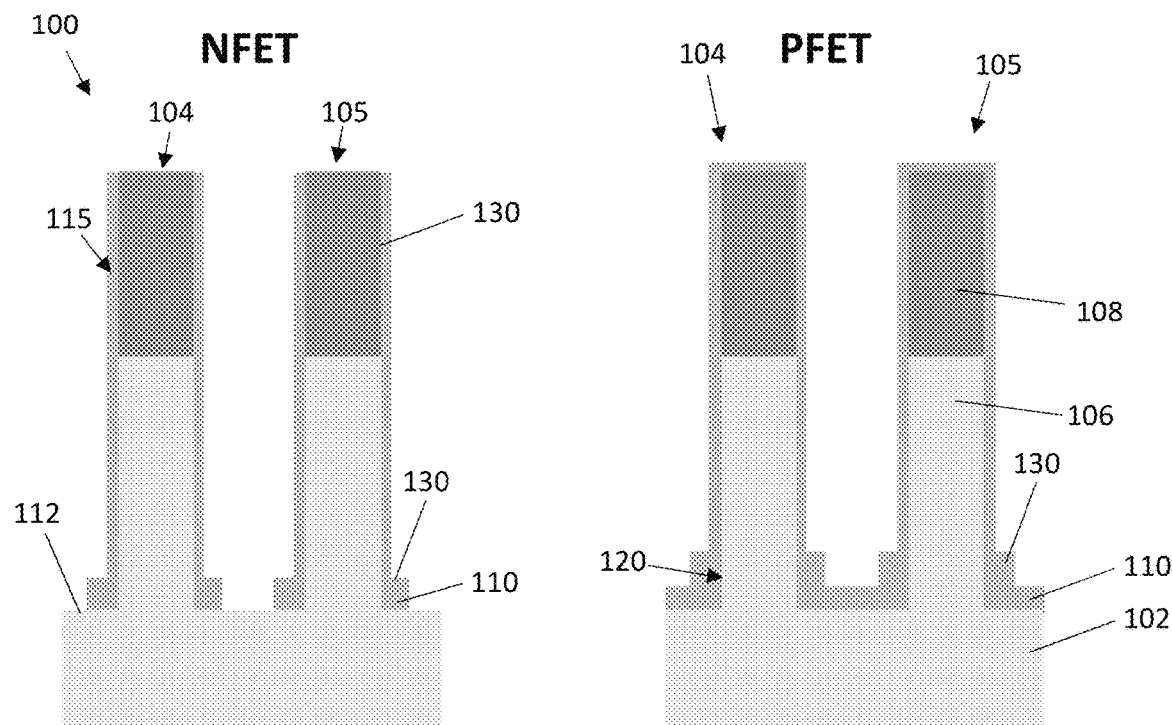

As shown in FIG. 4, an optical planarization layer (OPL) 132 may be formed over the PFET. As shown in FIG. 5, a vertical RIE, shown as arrows 131, on the NFET may be performed to remove a portion of the first spacer 110 and the second spacer 130 between the first and second gates 104, 105. In some embodiments, the first spacer 110 and the second spacer 130 may be removed selective to the upper surface 112 of the substrate so a gap 134 is formed. In some embodiments, the first spacer 110 and the second spacer 130 may be selectively removed by DHF. As shown in FIG. 6, the OPL 132 may then be removed (e.g., stripped) from the PFET.

Figure 7:
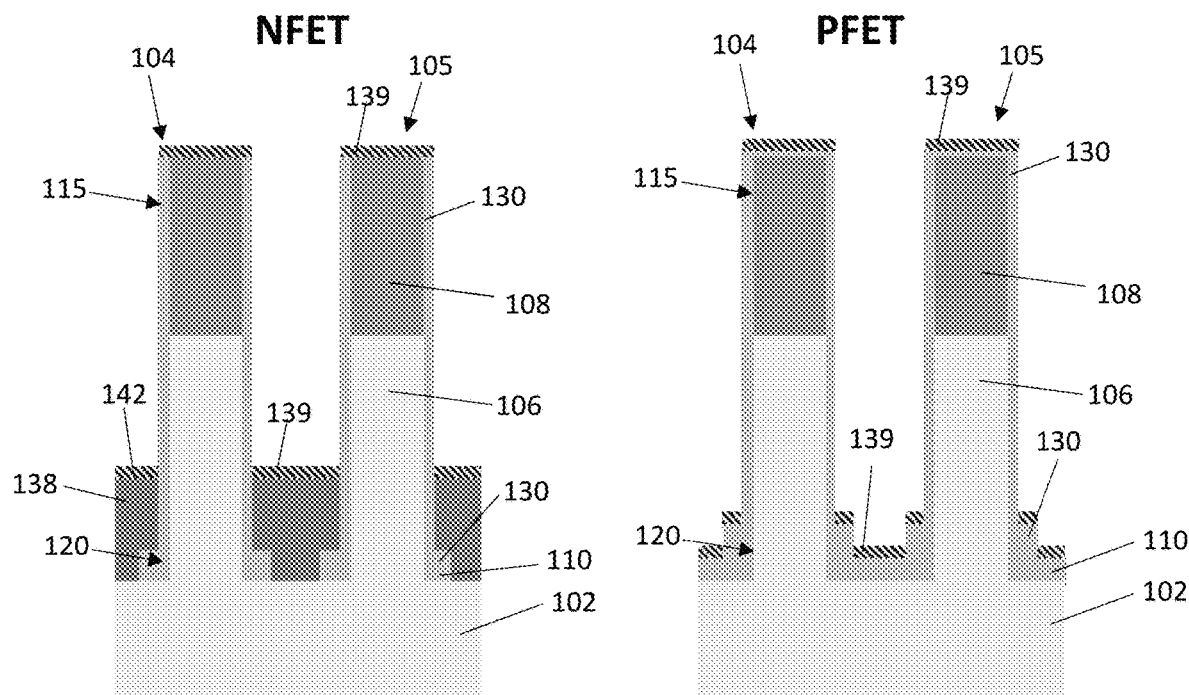

As shown in FIG. 7, a source/drain (S/D) epitaxial layer 138 is formed adjacent the first and second gates 104, 105 of the NFET. A stopping layer 139 may then be formed over the device 100, including atop the S/D epitaxial layer 138. In some embodiments, the stopping layer 139 may be a directional SiN deposited for epitaxial stopping. As shown, for the PFET, the stopping layer 139 may be formed just atop the first and second gates 104, 105 and along the lower portion 120 of the first and second gates 104, 105. In this non-limiting embodiment, the stopping layer 139 may not be formed along the sidewalls of the upper portion 115 of the first and second gates 104, 105. For the NFET, the stopping layer 139 may be formed just atop the first and second gates 104, 105 and the along a top surface 142 of the first S/D epitaxial layer 138.

Figure 8:
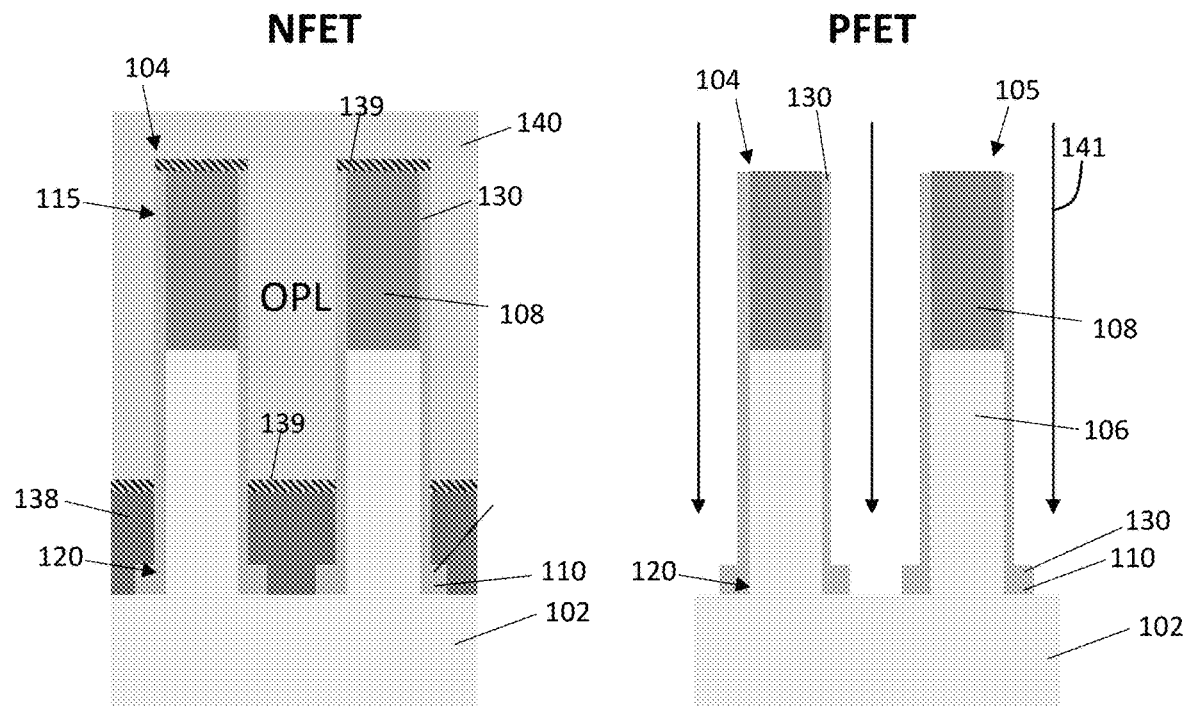

As shown in FIG. 8, an OPL 140 may be formed over the NFET, and a vertical RIE on the PFET, shown as arrows 141, may be performed to remove a portion of the first spacer 110 and the second spacer 130 between the first and second gates 104, 105. Furthermore, the RIE 141 may remove the stopping layer 139 and the second spacer 130 from atop the first and second gates 104, 105. In some embodiments, the RIE 141 may remove a portion of the hardmask 108 of the first and second gates 104, 105 of the PFET.

Figure 9:
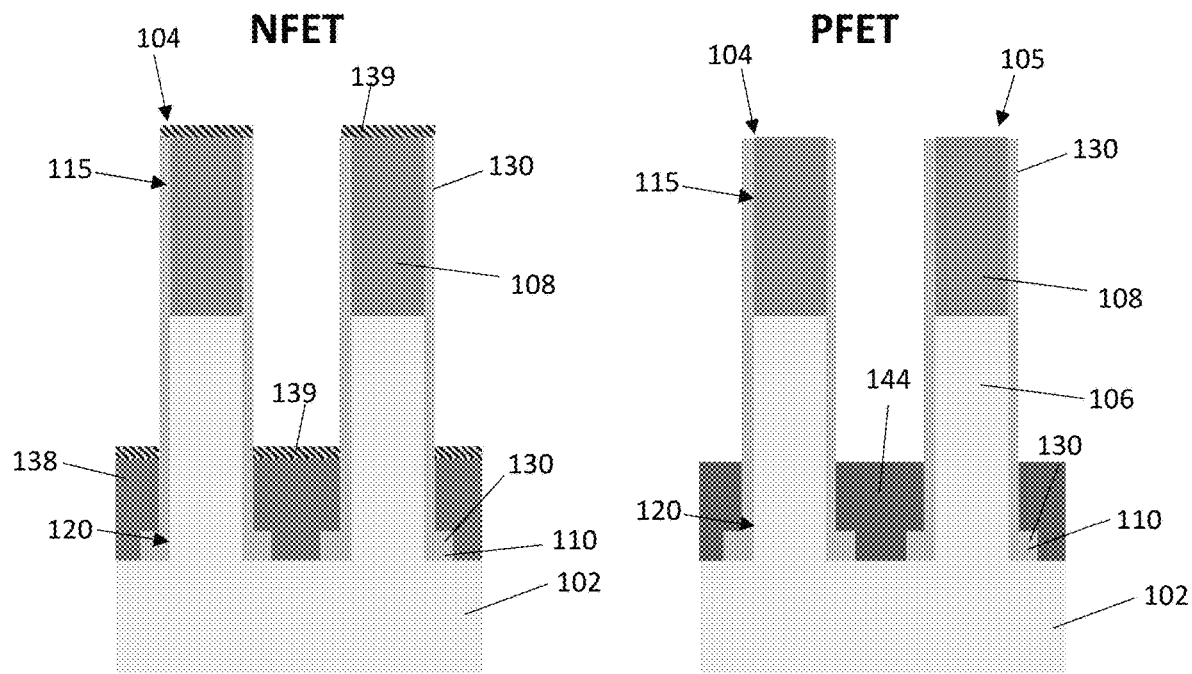
Figure 10:
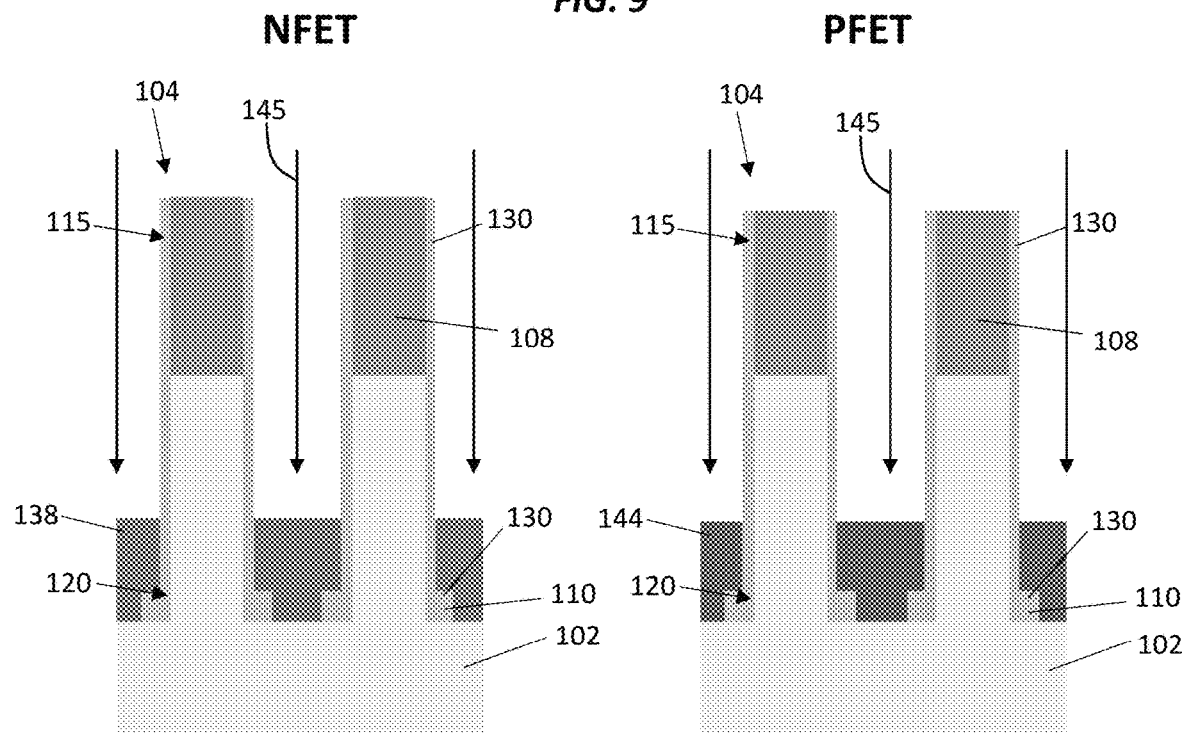

As shown in FIG. 9, the OPL layer 140 is removed (e.g., stripped), and a second S/D epitaxial layer 144 is then formed over the substrate 102 of the PFET. As shown in FIG. 10, a vertical RIE on the PFET and the NFET, shown as arrows 145, may be performed to remove the stopping layer 139 of the NFET, and to remove a portion of the hardmask 108 of the first and second gates 104, 105 of the PFET.

Figure 11:
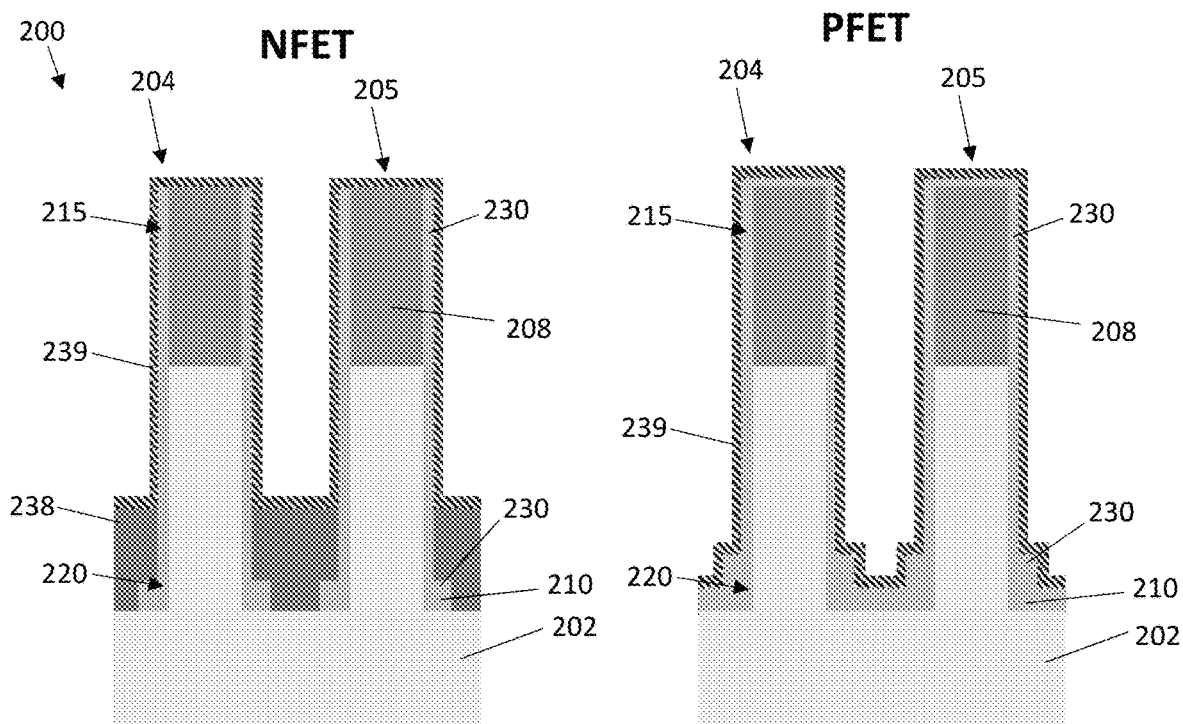
FIGS. 11-17 depict side cross-sectional views of an approach for forming a semiconductor device in accordance with embodiments of the present disclosure.

Turning now to FIG. 11, there is shown a cross-sectional view of a CMOS device (hereinafter "device") 200 according to embodiments of the disclosure. Both a NFET and a PFET of the device 200 will be shown and described. The device 200 may share many of the same elements of the device 100 shown in FIGS. 1-6 and, as such, will not be described again here in detail for the sake of brevity. As shown, a stopping layer 239 may be formed over the device 200. In some embodiments, the stopping layer 239 is a conformal SiN deposition for epi stop layer.

Figure 12:
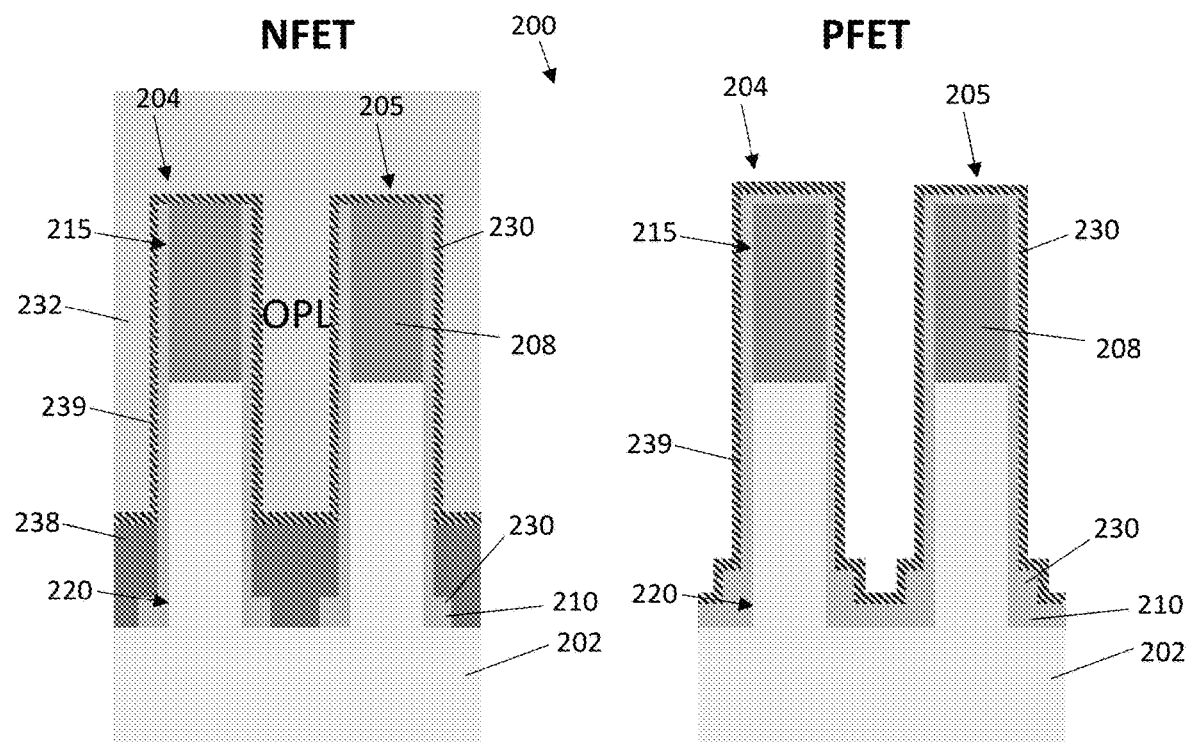
Figure 13:
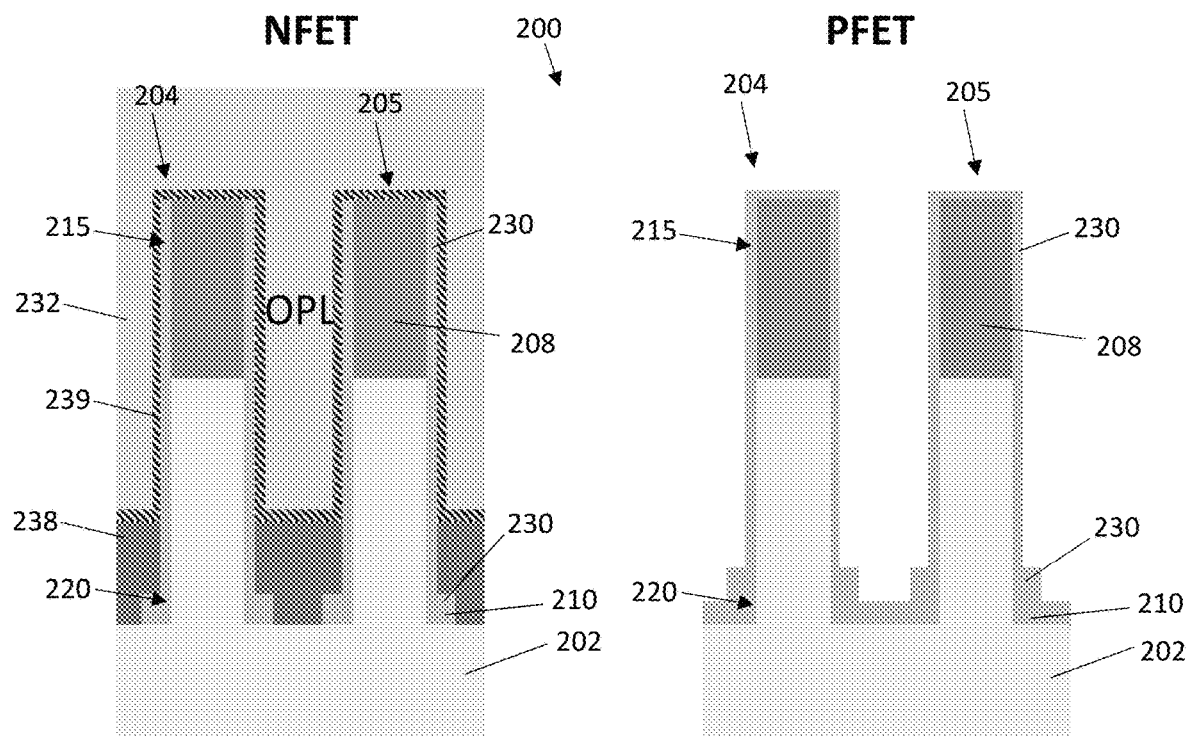
Figure 14:
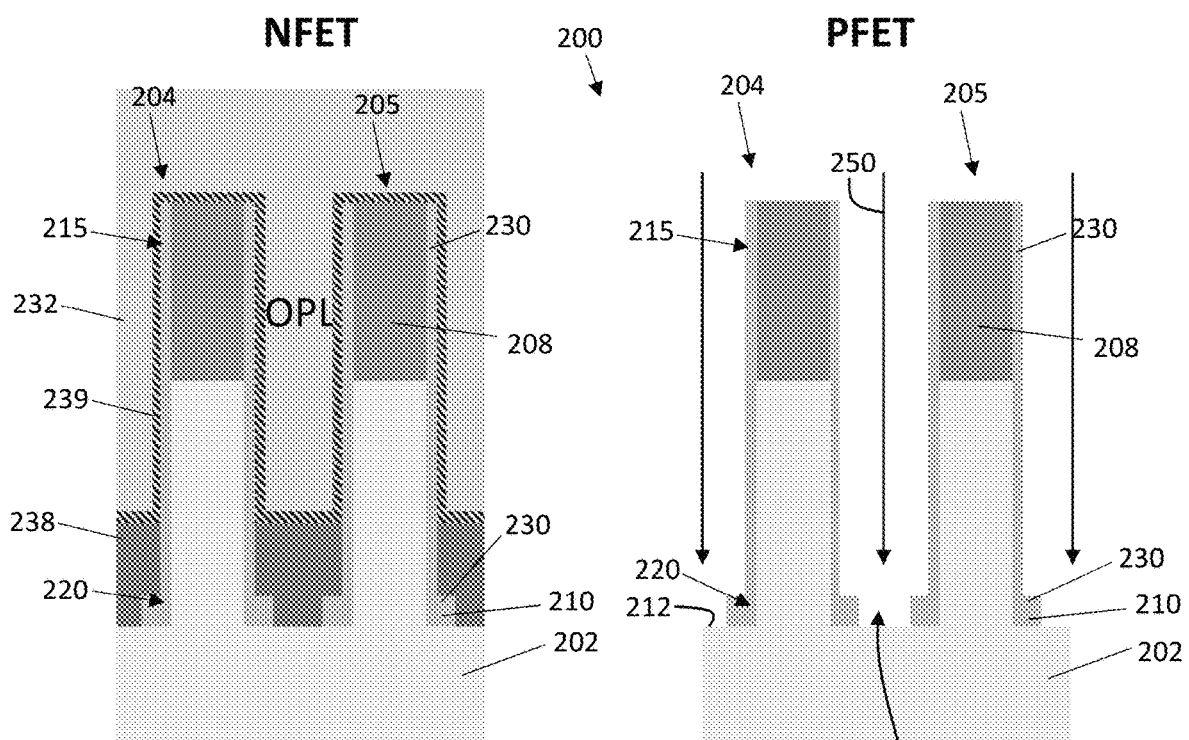
Figure 15:
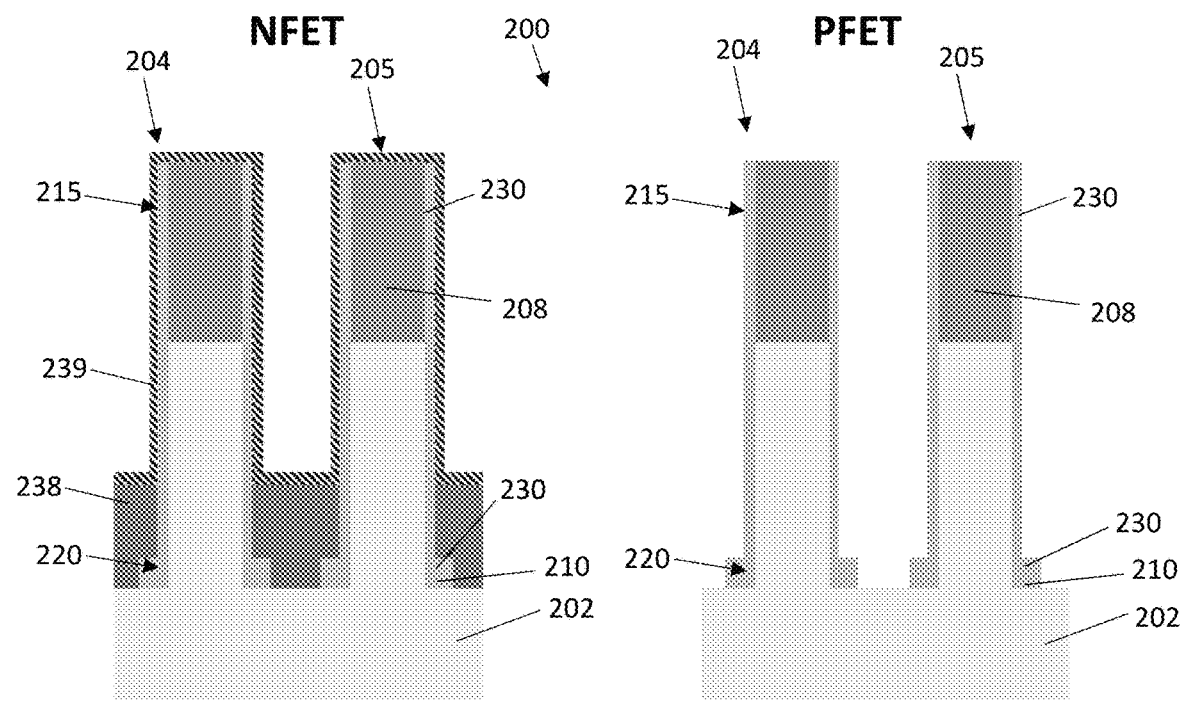

As shown in FIG. 12, an OPL 232 may be formed over the NFET. As shown in FIG. 13, the stopping layer 239 may then be removed from over the PFET while the OPL 232 is covering the NFET. In some embodiments, to provide selective removal of the stopping layer 239, the PFET may be subjected to a hydrofluoric acid in ethylene glycol. As shown in FIG. 14, a vertical RIE on the PFET, shown as arrows 250, may be performed to remove a portion of the first spacer 210 and the second spacer 230 between the first and second gates 204, 205. In some embodiments, the first spacer 210 and the second spacer 230 may be removed selective to the top surface 212 of the substrate so a gap 234 is formed. As shown in FIG. 15, the OPL 232 may then be removed (e.g., stripped) from the NFET.

Figure 16:
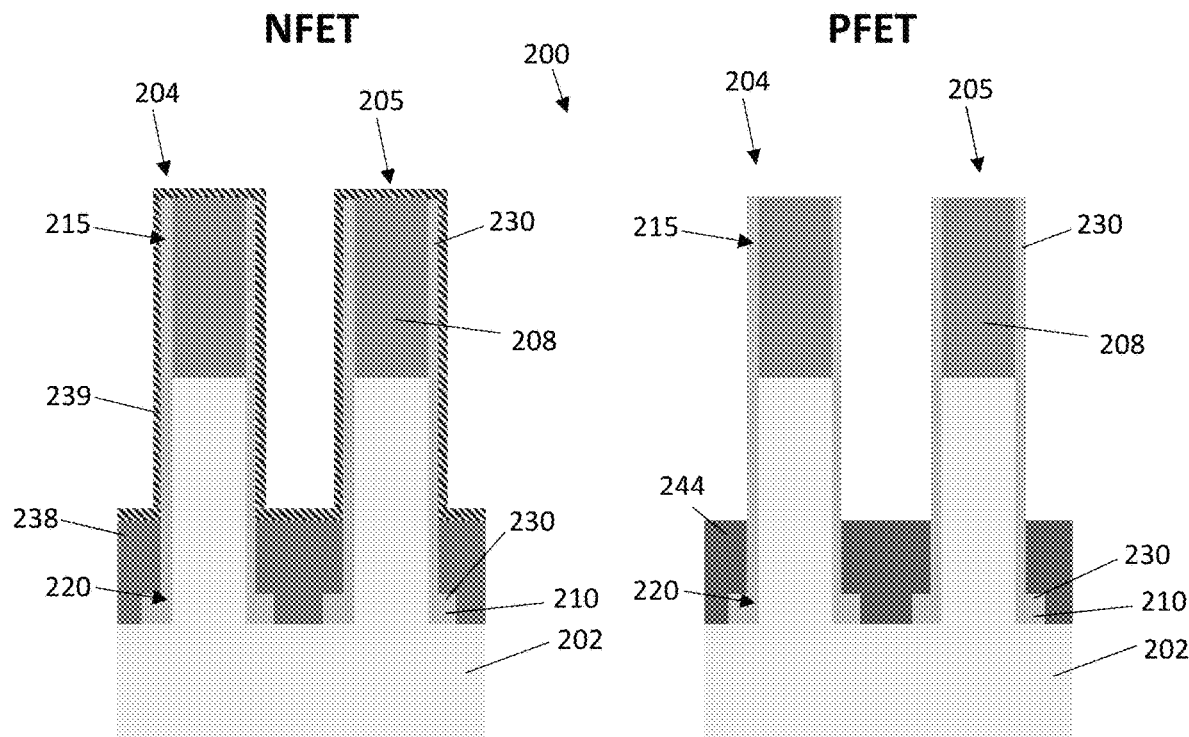
Figure 17:
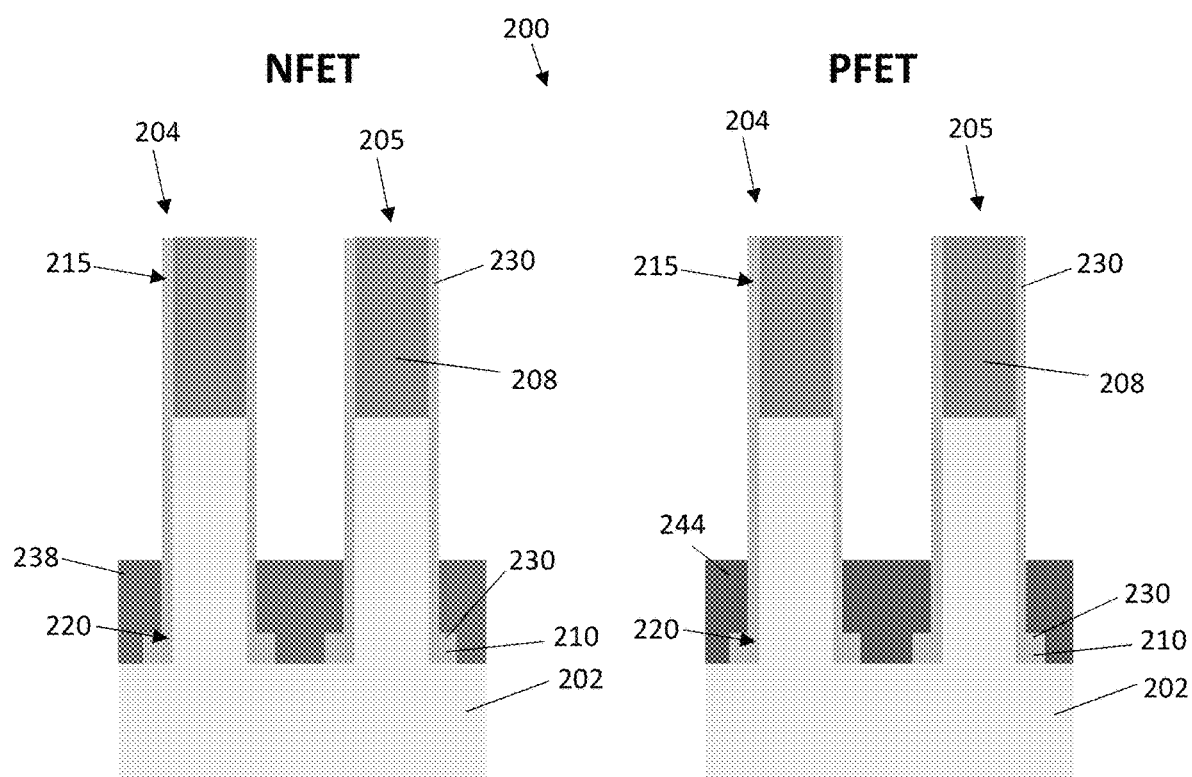

As shown in FIG. 16, a second S/D epitaxial layer 244 may be formed over the PFET. The second S/D epitaxial layer 244 may be deposited over the substrate 202 and along the lower portion 220 of the first and second gates 204, 205. Next, as shown in FIG. 17, the stopping layer 239 may then be removed from over the NFET. In some embodiments, to provide selective removal of the stopping layer 239, the NFET may be subjected to a hydrofluoric acid in ethylene glycol.

In various embodiments, design tools can be provided and configured to create the datasets used to pattern the semiconductor layers of devices 100 and 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

In view of the foregoing, at least the following advantages are achieved by the embodiments disclosed herein. A first advantage from a dual thickness gate spacer profile for NFET and PFET includes less damage on gate hardmask. A second advantage from the dual thickness gate spacer profile for NFET and PFET includes good control of gate spacer thickness. A third advantage from the dual thickness gate spacer profile for NFET and PFET includes less STI SiO2 loss. A fourth advantage from the dual thickness gate spacer profile for NFET and PFET includes less gate bending with thinner spacer.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a semiconductor device, comprising:
   providing a gate structure atop a substrate;
   forming a first spacer over the gate structure;
   removing the first spacer from just an upper portion of the gate structure by performing an angled etch disposed at a non-zero angle of inclination with respect to a perpendicular to a plane of the substrate;
   forming a second spacer over the upper portion of the gate structure and the first spacer along a lower portion of the gate structure after the angled etch is performed, wherein the first spacer along the lower portion of the gate structure includes a sidewall surface extending perpendicular to an upper surface of the substrate, wherein the second spacer is formed in direct contact with the sidewall surface of the first spacer, and wherein a thickness of the first spacer and the second spacer along the lower portion of the gate structure is greater than a thickness of the second spacer along the upper portion of the gate structure; and
   forming, after the second spacer is formed, a source/drain (S/D) epitaxial layer adjacent the gate structure.

2. The method of claim 1, wherein the S/D epitaxial layer is formed directly atop an upper surface of the substrate.

3. The method according to claim 1, wherein the angled etch is one of: a reactive ion etch or a diluted hydro-fluoric acid etch, and wherein the angled etch does not impact the lower portion of the gate structure.

4. The method according to claim 1, further comprising providing an additional gate structure atop the substrate, the additional gate structure including an upper portion and a lower portion, wherein the first spacer and the second spacer are further formed over the additional gate structure.

5. The method according to claim 4, further comprising etching a portion of the first spacer and the second spacer extending along a top surface of the substrate.

6. The method according to claim 4, further comprising forming a stopping layer over the gate structure and the additional gate structure.

7. The method according to claim 6, wherein the stopping layer is not formed along the upper portion of the gate structure, and wherein the stopping layer is not formed along an upper portion of the additional gate structure.

8. The method according to claim 6, wherein the stopping layer is formed along the upper portion of the gate structure and along the upper portion of the additional gate structure.

9. The method according to claim 6, wherein the stopping layer is removed using hydrofluoric acid in ethylene glycol.

10. A method of forming a CMOS device, comprising:
    providing a dummy gate structure atop a substrate;
    forming a first spacer over the dummy gate structure;
    removing the first spacer from just an upper portion of the dummy gate structure by performing an angled reactive ion etch disposed at a non-zero angle of inclination with respect to a perpendicular to a plane of the substrate;
    forming a second spacer over the upper portion of the dummy gate structure and over the first spacer along a lower portion of the dummy gate structure after the angled etch is performed, wherein the first spacer along the lower portion of the dummy gate structure includes a sidewall surface extending perpendicular to an upper surface of the substrate, wherein the second spacer is formed in direct contact with the sidewall surface of the first spacer, and wherein a thickness of the first spacer and the second spacer along the lower portion of the dummy gate structure is greater than a thickness of the second spacer along the upper portion of the dummy gate structure; and
    forming, after the second spacer is formed, a source/drain (S/D) epitaxial layer adjacent the dummy gate structure.

11. The method of claim 10, wherein the S/D epitaxial layer is formed directly atop an upper surface of the substrate.

12. The method according to claim 10, wherein the angled reactive ion etch does not impact the lower portion of the dummy gate structure.

13. The method according to claim 10, further comprising providing an additional dummy gate structure atop the substrate, the additional dummy gate structure including an upper portion and a lower portion, wherein the first spacer and the second spacer are further formed over the additional dummy gate structure.

14. The method according to claim 13, further comprising etching a portion of the first spacer and the second spacer between the dummy gate structure and the additional dummy gate structure, wherein the portion extends along a top surface of the substrate.

15. The method according to claim 13, further comprising forming a stopping layer over the dummy gate structure and the additional dummy gate structure.

16. The method according to claim 15, wherein the stopping layer is not formed along the upper portion of the gate structure, and wherein the stopping layer is not formed along an upper portion of the additional dummy gate structure.

17. The method according to claim 15, wherein the stopping layer is formed along the upper portion of the gate structure and along the upper portion of the additional dummy gate structure.

18. A method of forming a CMOS device, comprising:
    providing a dummy gate structure atop a substrate;
    forming a first gate spacer over the dummy gate structure, wherein the first gate spacer extends along an upper surface of the substrate;
    removing the first gate spacer from just an upper portion of the dummy gate structure by performing an angled reactive ion etch disposed at a non-zero angle of inclination with respect to a perpendicular to a plane of the upper surface of the substrate;
    forming a second gate spacer over the upper portion of the dummy gate structure and over the first gate spacer along a lower portion of the dummy gate structure after the angled etch is performed, wherein the first gate spacer along the lower portion of the dummy gate structure includes a sidewall surface extending perpendicular to an upper surface of the substrate, wherein the second gate spacer is formed directly in direct contact with the sidewall surface of the first gate spacer, and wherein a thickness of the first gate spacer and the second gate spacer along the lower portion of the dummy gate structure is greater than a thickness of the second gate spacer along the upper portion of the dummy gate structure; and
    forming, after the second spacer is formed, a source/drain (S/D) epitaxial layer adjacent the dummy gate structure.

19. The method according to claim 18, wherein the angled reactive ion etch does not impact the lower portion of the dummy gate structure.

20. The method of claim 18, further comprising:
- providing an additional dummy gate structure atop the substrate, the additional dummy gate structure including an upper portion and a lower portion, wherein the first gate spacer and the second gate spacer are further formed over the additional dummy gate structure; and
- etching a portion of the first gate spacer and the second gate spacer between the dummy gate structure and the additional dummy gate structure, wherein the portion extends along the upper surface of the substrate.

* * * * *